(12) United States Patent
Suda

(10) Patent No.: US 8,044,504 B2
(45) Date of Patent: Oct. 25, 2011

(54) SEMICONDUCTOR DEVICE INCLUDING AN INNER CONDUCTIVE LAYER WHICH IS CUT OUT IN THE VICINITY OF A CORNER

(75) Inventor: Tooru Suda, Miyawaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 12/553,182

(22) Filed: Sep. 3, 2009

(65) Prior Publication Data

US 2010/0096751 A1   Apr. 22, 2010

(30) Foreign Application Priority Data

Oct. 20, 2008   (JP) .................................. 2008-269536

(51) Int. Cl.
*H01L 23/12*    (2006.01)
(52) U.S. Cl. . 257/700; 257/738; 257/747; 257/E23.069; 438/613
(58) Field of Classification Search .................. 257/738, 257/700
See application file for complete search history.

(56) References Cited

U.S. PATENT DOCUMENTS

| | | | |
|---|---|---|---|
| 2003/0153160 A1* | 8/2003 | James et al. | 438/438 |
| 2004/0183205 A1* | 9/2004 | Yamaguchi | 257/774 |
| 2004/0251544 A1* | 12/2004 | Hussa | 257/734 |
| 2007/0194433 A1 | 8/2007 | Suwa et al. | |

FOREIGN PATENT DOCUMENTS

JP    2007-317754    12/2007

OTHER PUBLICATIONS

Zhu, Liping. Thermal Fatigue Reliability Modeling and Analysis of BGA Socket Assembly in System Board with Preloaded Use Condition. 2006. Proceedings of the IEEE 2006 Electronic Components and Technology Conference; pp. 748-755.*

* cited by examiner

*Primary Examiner* — Ajay K Arora
(74) *Attorney, Agent, or Firm* — Turocy & Watson, LLP

(57) ABSTRACT

A semiconductor device, includes: an organic multilayer wiring substrate having an inner conductive layer; a semiconductor element mounted and connected on one surface of the wiring substrate; and a plurality of solder balls disposed on the other surface in a grid array. A defect portion is formed at an area corresponding to a corner solder ball disposed at an outer peripheral corner, or at an area corresponding to the corner solder ball and peripheral solder balls at the inner conductive layer. Temperature rises of the solder balls disposed in a vicinity of the corner are suppressed, and therefore, the semiconductor device of which fatigue life is prolonged and superior in reliability can be obtained.

20 Claims, 5 Drawing Sheets

SEMICONDUCTOR DEVICE INCLUDING AN INNER CONDUCTIVE LAYER WHICH IS CUT OUT IN THE VICINITY OF A CORNER

CROSS-REFERENCE TO RELATED APPLICATIONS

This application is based upon and claims the benefit of priority from the prior Japanese Patent Application No. 2008-269536, filed on Oct. 20, 2008; the entire contents of which are incorporated herein by reference.

BACKGROUND OF THE INVENTION

Conventionally, a semiconductor device has been proposed in which a semiconductor element is mounted on one surface (for example, at a front surface) of a wiring substrate, electrodes (lands) are arranged in vertical and horizontal directions in a grid state at a rear surface side, and solder balls connecting to a mounting substrate such as a printed wiring board are disposed on these electrodes (lands), so as to make high function and miniaturization of various electronic equipments easy. The semiconductor device as stated above is called as a BGA (Ball Grid Array) type semiconductor device (for example, refer to JP-A 2007-317754 (KOKAI)). The wiring substrate has a multilayer structure in which insulating layers composed of an organic material such as glass epoxy and conductive layers are layered alternately to be integrated, and an inner conductive layer is made of a copper foil to be a power plane layer or a ground plane layer.

In the semiconductor device having the structure as stated above, a major part of heat generated by an operation of the semiconductor element is conducted to the mounting substrate from the wiring substrate via the solder balls, and it is discharged from the mounting substrate. Temperatures of the solder balls positioning along a heat conductive path become high resulting from this heat conduction. The inner conductive layer constituting the wiring substrate is formed in a plane state using the copper foil of which heat conductivity is good. Accordingly, the temperatures of the solder balls disposed in a vicinity of four corners also become high, because the heat is conducted not only to an area just below the semiconductor element but also to a peripheral area at the rear surface of the wiring substrate. Kirkendall void is easy to be generated at electrode junctions of the solder balls when the temperature becomes high.

On the other hand, when the heat is added under a state in which the semiconductor device is mounted on the mounting substrate via the solder balls, a strain (thermal strain) is generated on the solder ball caused by a difference of coefficients of thermal expansion between the wiring substrate of the semiconductor device and the mounting substrate. The farther the solder ball is disposed from a center portion of the semiconductor device, the larger the thermal strain becomes. The thermal strain of the solder ball disposed in the vicinity of the corner portion therefore becomes large, and it becomes easy to break. Accordingly, an operating life becomes short resulting from fatigue.

BRIEF SUMMARY OF THE INVENTION

A semiconductor device according to a first aspect of the present invention comprises a wiring substrate including a insulating layer composed of an organic insulating base material and an inner conductive layer; a semiconductor element mounted on one surface of the wiring substrate, and electrically connected to the wiring substrate; and a plurality of solder balls disposed on the other surface of the wiring substrate, in which an area is defected at the inner conductive layer, the area corresponding to the solder ball disposed at an outer peripheral corner portion, or an area corresponding to the solder balls disposed at the outer peripheral corner portion and at a periphery thereof.

A semiconductor device according to a second aspect of the present invention comprises a wiring substrate including a insulating layer composed of an organic insulating base material and an inner conductive layer; a semiconductor element mounted on one surface of the wiring substrate, and electrically connected to the wiring substrate; and a plurality of solder balls disposed on the other surface of the wiring substrate, in which the inner conductive layer has a slit shape defect portion in a vicinity of an area corresponding to the solder ball disposed at an outer peripheral corner portion, and the outer peripheral corner portion of the inner conductive layer is isolated by this slit shape defect portion in an island state.

DETAILED DESCRIPTION OF THE INVENTION

Hereinafter, embodiments of the present invention are described. Note that the embodiments will be described with reference to the drawings, but these drawings are provided only for an illustrative purpose and by no means are intended to limit the present invention.

Figure 1:
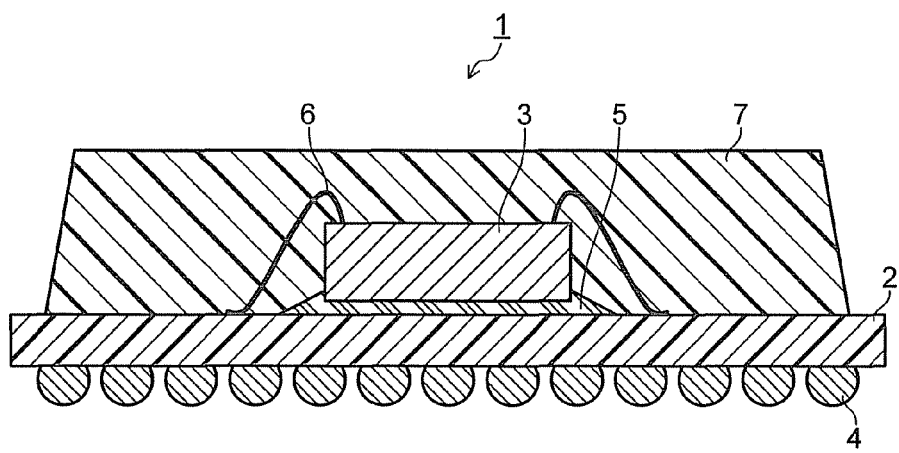
FIG. 1 is a sectional view showing a BGA type semiconductor device according to a first embodiment of the present invention.

FIG. 1 is a sectional view showing a BGA type semiconductor device according to a first embodiment of the present invention. This semiconductor device 1 includes a wiring substrate 2, a semiconductor element 3 mounted on the wiring substrate 2, and plural solder balls 4 disposed on the other surface of the wiring substrate 2. This semiconductor device 1 can be connected to a mounting substrate such as a printed wiring board via the plural solder balls 4.

Figure 2:
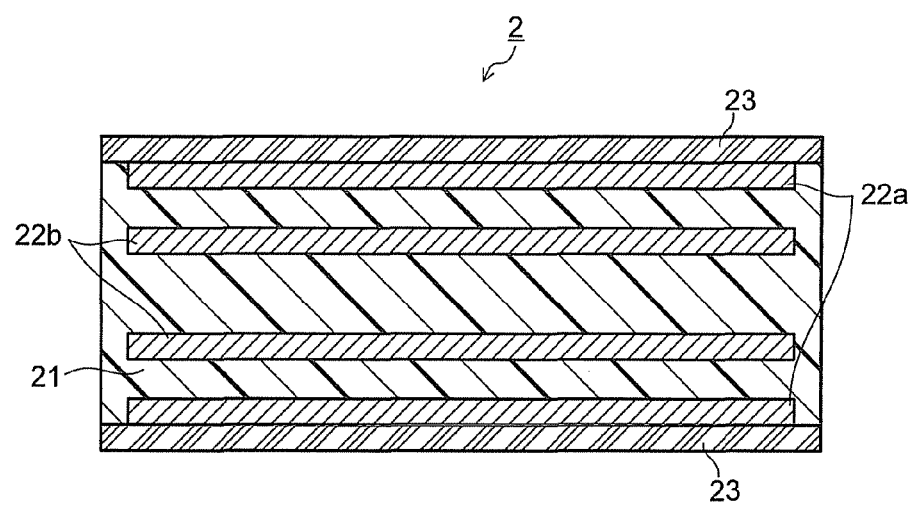
FIG. 2 is a sectional view of a wiring substrate used for the first embodiment.

The wiring substrate 2 has a multilayer structure in which plural insulating base layers 21 composed of an organic material such as glass epoxy and plural conductive layers 22 are alternately layered and integrated as a cross-sectional structure thereof is illustrated in FIG. 2. A first layer and a fourth layer of the plural conductive layers 22 are outer conductive layers 22a, and they are formed in a pattern shape by a conductive metal whose main component is copper. Solder resist layers 23 are respectively formed on these outer conductive layers 22a. Besides, a second layer and a third layer of the conductive layers are inner conductive layers 22b for power and ground, and they are plane layers which are formed using copper foils.

The semiconductor element 3 is adhered on one surface (an upper surface in FIG. 1) of the wiring substrate 2 with an adhesive (die attach agent) layer 5. Electrode pads of the semiconductor element 3 and connection pads of the wiring substrate 2 (both are not illustrated) are connected by bonding wires 6 such as Au wires (wire bonding). Besides, wire bonding portions and so on between the semiconductor element 3 and the wiring substrate 2 are sealed with molding resin, the molding resin layer 7 being composed of epoxy resin and so on.

Figure 3:
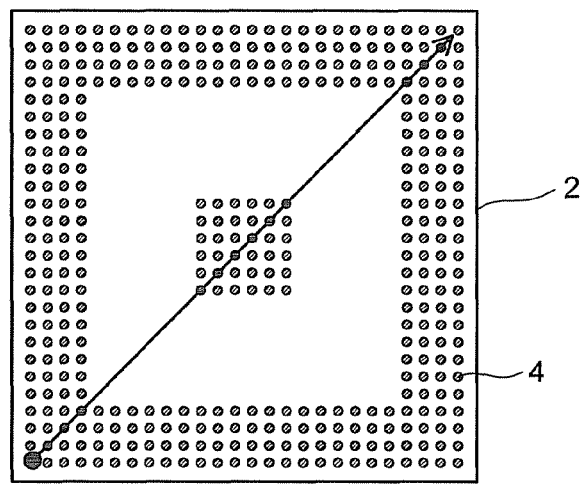
FIG. 3 is a plan view showing a disposed state of solder balls in the first embodiment.

The solder ball 4 is composed of, for example, solder whose main component is tin. Plural lands (not illustrated) are formed on an opposite surface (a lower surface in FIG. 1) from the semiconductor element mounting surface of the wiring substrate 2 while disposed in a grid array state, and the solder ball 4 is formed on one of these lands. The plural solder balls 4 are arranged in the grid array state in an area just below the semiconductor element 3 and a peripheral area thereof on the lower surface of the wiring substrate 2, as illustrated in FIG. 3.

Figure 4:
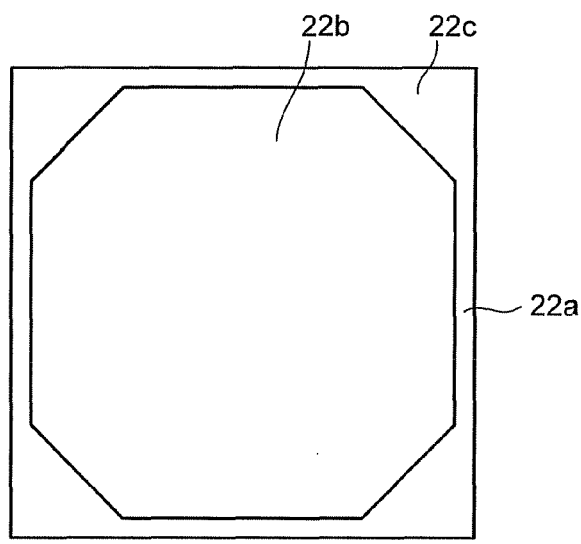
FIG. 4 is a plan view showing a shape of an inner conductive layer in the first embodiment.

In the wiring substrate 2 illustrated in FIG. 2, at least one of the inner conductive layers 22b has a planer shape in which areas in a vicinity of four corners (four corner portions) are obliquely removed and defected from a rectangular planer shape, as illustrated in FIG. 4. Incidentally, the corner portions to be removed and defected are not necessarily four corners, but an effect can be achieved if at least one corner among the four corners is removed and defected.

Figure 5:
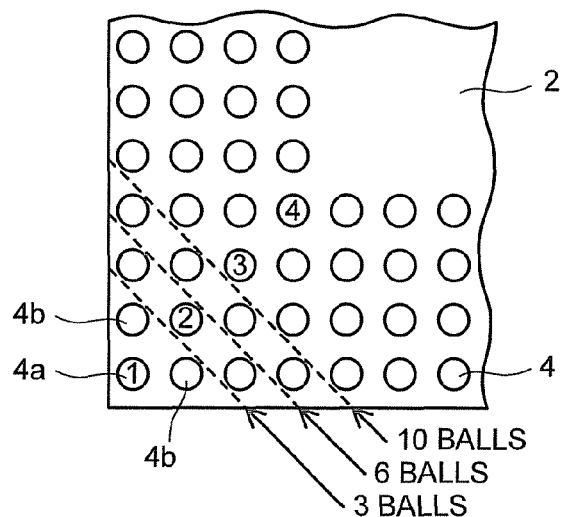
FIG. 5 is a enlarged plan view showing the disposed state of corner peripheral solder balls in the first embodiment.

The defected corner area of the inner conductive layer 22b (herein after, represented by a defect corner area) 22c is an area corresponding to a solder ball disposed at an outer peripheral corner of a disposition area (herein after, represented by a corner solder ball) 4a among the plural solder balls 4 disposed in the grid array state, or an area corresponding to the corner solder ball 4a and plural solder balls 4b at periphery thereof (herein after, represented by peripheral solder balls) as showed in FIG. 5. The corner solder ball 4a and the peripheral solder balls 4b are put together to be represented by a corner peripheral solder ball group. Besides, the corresponding area means an area positioning just above (right above) or just below (right below) the solder balls. Namely, the area corresponding to the corner solder ball 4a and so on is the area positioning right above the corner solder ball 4a. More specifically, the defect corner area 22c of the inner conductive layer 22b is an area right above a solder ball group divided by an oblique line connecting the solder balls 4 at n-th columns in each of vertical and horizontal arranging directions while setting the corner solder ball 4a as a starting point.

It is preferable that a value of "n" is set to be from one to four by a reason described below. Incidentally, when the value of "n" is one, two, three and four, the number of the corner peripheral solder ball group becomes one, three, six and ten, as illustrated in FIG. 5. When the value of "n" is one, the area only corresponding to the corner solder ball 4a is the defect corner area 22c of the inner conductive layer 22b. In the inner conductive layer 22b, conduction of heat to the corner peripheral solder ball group disposed at the area right below the defect corner area 22c becomes low and a temperature rise of the solder ball is prevented, as an area of the defect corner area 22c becomes large. However, an unfavorable influence may appear when the area of the defect corner area 22c becomes too large because the heat conductivity (heat release performance) as a whole of the wiring substrate 2 drastically decreases. When the corner peripheral solder ball group is constituted by the solder balls 4 up to the fourth column including the corner solder ball 4a, the influence such as the decrease of the heat release performance of the wiring substrate 2 seldom appears. Accordingly, it is preferable that the defect corner area 22c of the inner conductive layer 22b is set to be the area corresponding to the solder ball group divided by the oblique line connecting the solder balls 4 at the fourth columns at the maximum.

In the semiconductor device according to the first embodiment constituted as stated above, the inner conductive layer 22b has the planer shape in which the areas at four corners are obliquely removed from the rectangular, and therefore, the heat generated at the semiconductor element 3 and conducted to the inner conductive layer 22b is difficult to be conducted to the defect corner area 22c whose conductive layer composed of the copper foil is removed. Accordingly, the heat from the semiconductor element 3 is difficult to be conducted to the corner peripheral solder ball group (the corner solder ball 4a and the peripheral solder balls 4b) disposed at the area right below the defect corner area 22c. Consequently, fatigue lives of these solder balls become long as a result that the temperature rises of the corner solder ball 4a and the peripheral solder balls 4b are prevented.

In the first embodiment of the present invention, an effect obtained by providing the defect corner area 22c in the inner conductive layer 22b is examined as stated below.

At first, a simulation is performed by using a computer to examine the influence of the heat conductivity of the wiring substrate on the temperature of the solder ball. A relation between an equivalent heat conductivity of the wiring substrate and the temperature of the solder ball in a natural convection environment is determined. The temperatures are calculated as for each of a solder ball disposed at a center of the wiring substrate (herein after, represented by a center solder ball) and a solder ball disposed at an outer peripheral corner (a corner solder ball).

The simulation is performed while using the BGA type semiconductor device as a model. The BGA type semiconductor device has a structure of which insulating base material is glass epoxy and in which a semiconductor chip in 10 mm square is mounted on a four layer wiring substrate (35 mm×35 mm) in which two layers of inner copper foils having rectangular planar shapes without the defect corner areas are layered, and plural solder balls are disposed in a grid array state on an opposite surface. The equivalent heat conductivity is changed by changing a rate of thicknesses of the inner copper foil and the insulating base material, and the temperatures of the center solder ball and the corner solder ball are measured, in the BGA semiconductor device. Measured results are illustrated in FIG. 6.

Figure 6:
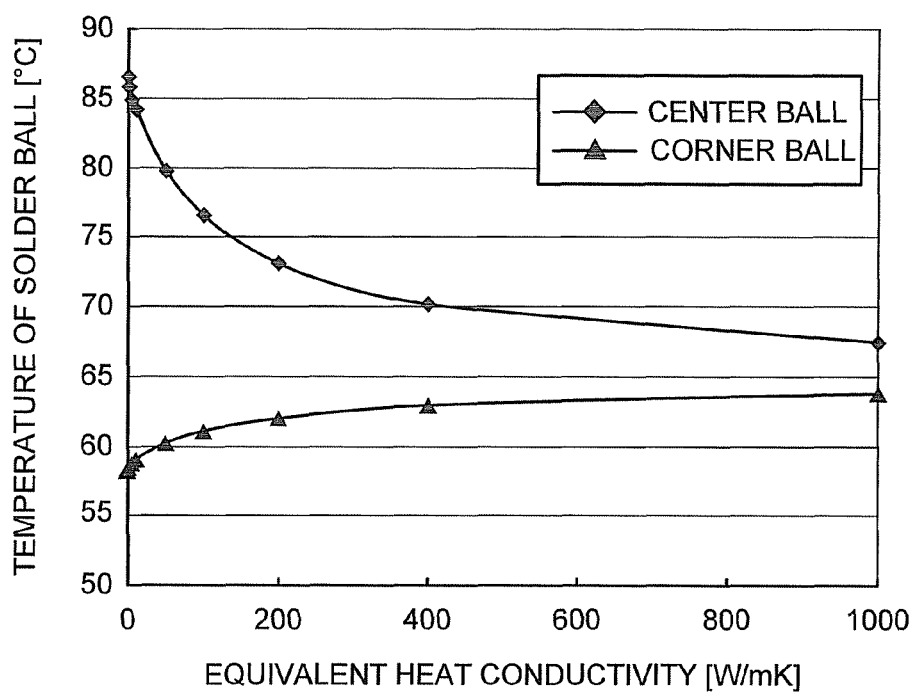
FIG. 6 is a graphic chart showing a determined result of a relation between an equivalent heat conductivity of the wiring substrate and a temperature of the solder ball by a simulation.

It can be seen from the graphic chart in FIG. 6 that the temperature of the corner solder ball becomes high as the equivalent heat conductivity of the wiring substrate becomes high, when the defect corner area is not provided at the inner copper foil.

Subsequently, a simulation is performed by using a computer to verify that the temperature of the solder ball 4 disposed at the area corresponding to the defect corner area 22c decreases by providing the defect corner area 22c at the inner conductive layer 22b, in the semiconductor device according to the first embodiment.

The simulation is performed while using the above-stated BGA type semiconductor device as a model. The temperatures of the solder balls at the respective positions are calculated when the inner conductive layers 22b at the areas obliquely dividing the solder balls at the first column, second column, third column and fourth column in the vertical and horizontal arranging directions are respectively defected while using the corner solder ball 4a as the starting point, and in the conventional semiconductor device in which the defect corner area 22c is not provided at the inner conductive layer 22b. The results are illustrated in FIG. 7.

Figure 7:
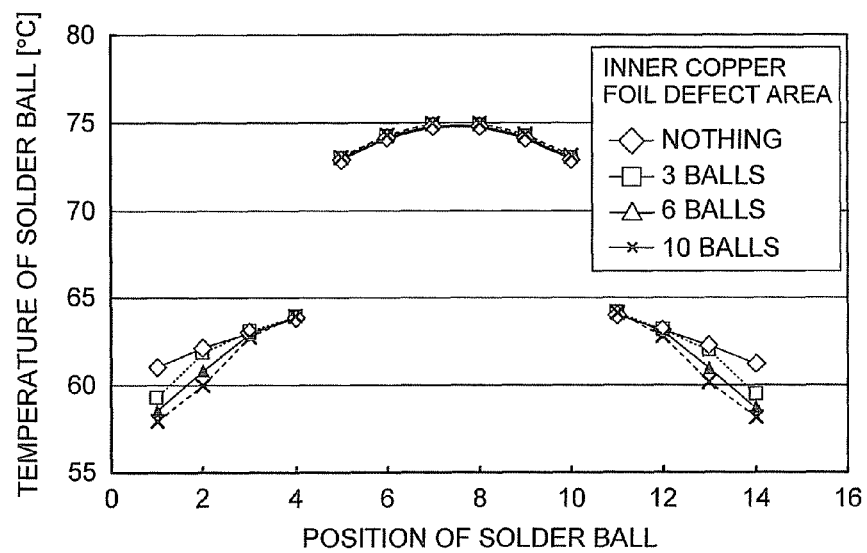
FIG. 7 is a graphic chart showing a result of a relation between a position of the solder ball and the temperature of the solder ball determined by a simulation in the semiconductor device of the first embodiment.

In the graphic chart of FIG. 7, a horizontal axis represents a position number of the solder ball. This position number increases sequentially as the array increases in a diagonal line direction illustrated by an arrow while setting a position at a bottom left corner as a starting point (number 1) in the solder ball arrangement illustrated in FIG. 3. The position numbers of the solder balls are also described in the solder balls in an enlarged view in FIG. 5.

It can be seen from the simulation result illustrated in FIG. 7 that the temperatures of the corner solder ball 4a and the peripheral solder balls 4b of a semiconductor device, the semiconductor device having the defect corner areas 22c corresponding to the respective areas obliquely dividing the solder balls 4b at the first column to the fourth column at the inner conductive layer 22b, decrease compared to those of the conventional semiconductor device. Accordingly, the fatigue life of the corner peripheral solder ball group can be prolonged, and the BGA type semiconductor device with high reliability can be obtained.

Figure 8:
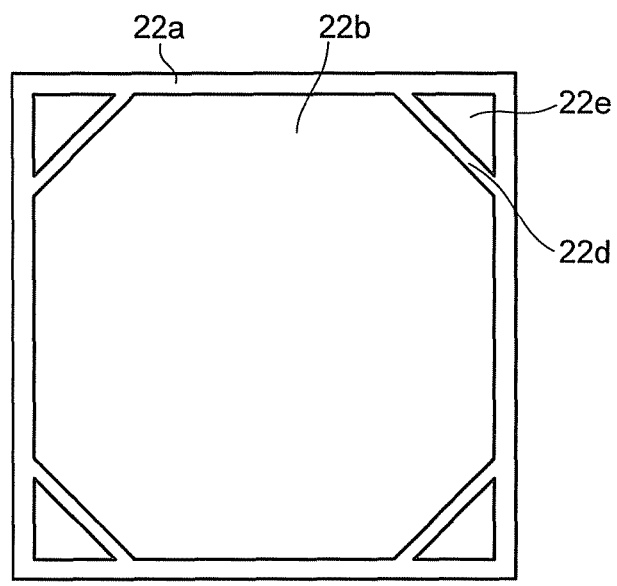
FIG. 8 is a plan view showing a shape of an inner conductive layer in a second embodiment of the present invention.

Next, another embodiment of the present invention is described. FIG. 8 is a plan view illustrating a planar shape of the inner conductive layer 22b in a second embodiment of the present invention. The other portion is constituted as same as the first embodiment in the second embodiment, and therefore, it is not illustrated in the drawing.

In a semiconductor device according to the second embodiment, at least one layer of the inner conductive layers 22b has a planer shape in which a defect portion 22d in a slit shape is formed in a vicinity of four corners of a rectangular planer shape, and the corner area is isolated in an island state as illustrated in FIG. 8. Incidentally, the corner portions having the defect portions 22d in the slit-shapes are not necessarily be four corners, and it is possible to achieve an effect if the defect portion 22d is formed at least at one corner.

A corner area (herein after, represented by an isolated corner area) 22e isolated in the island state positions at the area corresponding to the corner peripheral solder ball group, namely, right above the corner peripheral solder ball group as same as the first embodiment. More specifically, the isolated corner area 22e is an area right above the corner peripheral solder ball group which is divided by an oblique line connecting the respective solder balls 4 at the first columns to fourth columns in the vertical and horizontal arranging directions while setting the corner solder ball 4a as a starting point. When the corner peripheral solder ball group corresponding to the isolated corner area 22e corresponds to the solder balls 4 up to the fourth column including the corner solder ball 4a, an influence such as a decrease of heat release performance of the wiring substrate 2 seldom appears.

In the semiconductor device according to the second embodiment constituted as stated above, the inner conductive layer 22b has the planer shape in which the areas at the four corners of the rectangular are isolated in the island states by the defect portions 22d in the slit shapes, and therefore, the heat generated from the semiconductor element 3 and conducted to the inner conductive layer 22b is difficult to be conducted to the isolated corner areas 22e of the inner conductive layer 22b. Accordingly, the heat from the semiconductor element 3 is difficult to be conducted to the corner peripheral solder ball group (the corner solder ball 4a and the peripheral solder balls 4b) disposed at the area right below the isolated corner area 22e. Consequently, the temperature rises of the corner solder ball 4a and the peripheral solder balls 4b are prevented, the fatigue lives of these solder balls become long, and therefore, the semiconductor device with high reliability can be obtained.

Incidentally, the above-described constitutions, shapes, sizes and disposition relationships are only to illustrate schematically, and compositions (materials) and so on of each constitution are to be considered in all respects as illustrative and no restrictive. Namely, the present invention is not limited to the above-described embodiments, and may be modified in other specific forms without departing from the spirit or essential characteristics thereof.

What is claimed is:

1. A semiconductor device, comprising:
a wiring substrate including an insulating layer composed of an organic insulating base material and an inner conductive layer;
a semiconductor element mounted on one surface of the wiring substrate, and electrically connected to the wiring substrate; and
a plurality of solder balls disposed on the other surface of the wiring substrate,
wherein an area of the inner conductive layer is cut out, the area corresponding to the solder ball disposed at an outer peripheral corner portion, or an area corresponding to the solder balls disposed at the outer peripheral corner portion and at a periphery thereof.

2. The semiconductor device according to claim 1, wherein the inner conductive layer is a plane layer made of a copper foil.

3. The semiconductor device according to claim 2, wherein the plane layer is a power layer or a ground layer.

4. The semiconductor device according to claim 1, wherein the solder balls are arranged in a grid array on the other surface of the wiring substrate.

5. The semiconductor device according to claim 4, wherein the solder balls are disposed in an area just below the semiconductor element and in an area periphery thereof.

6. The semiconductor device according to claim 4, wherein the inner conductive layer has a quadrilateral shape, the area is a triangular area in the vicinity of a corner of the quadrilateral, the triangle has two sides respectively corresponding to four consecutive balls in the first row or column of the grid array of the solder balls.

7. The semiconductor device according to claim 4, wherein the inner conductive layer has a planer shape in which an area in a vicinity of a corner portion is obliquely removed from a rectangular planer shape.

8. The semiconductor device according to claim 1, wherein the wiring substrate has an insulating layer composed of glass epoxy.

9. The semiconductor device according to claim 1, wherein an electrical connection portion of the semiconductor element to the wiring substrate is sealed with molding resin.

10. The semiconductor device according to claim 1, wherein the semiconductor device can be mounted on a mounting substrate via the solder balls.

11. A semiconductor device, comprising:
a wiring substrate including an insulating layer composed of an organic insulating base material and an inner conductive layer;
a semiconductor element mounted on one surface of the wiring substrate, and electrically connected to the wiring substrate; and a plurality of solder balls disposed on the other surface of the wiring substrate,
wherein the inner conductive layer has:
  a main area, and
  a corner area isolated from the main area by a slit shape area without the inner conductive layer and a solder ball.

12. The semiconductor device according to claim 11, wherein the inner conductive layer is a plane layer made of a copper foil.

13. The semiconductor device according to claim 12, wherein the plane layer is a power layer or a ground layer.

14. The semiconductor device according to claim 11, wherein the solder balls are arranged in a grid array on the other surface of the wiring substrate.

15. The semiconductor device according to claim 14, wherein the solder balls are disposed in an area just below the semiconductor element and in an area periphery thereof.

16. The semiconductor device according to claim 14, wherein the corner area is a triangular area having two sides, each side corresponds to four consecutive balls in the first row or column of the solder balls.

17. The semiconductor device according to claim 14, wherein the inner conductive layer has a planer shape.

18. The semiconductor device according to claim 11, wherein the wiring substrate has an insulating layer composed of glass epoxy.

19. The semiconductor device according to claim 11, wherein an electrical connection portion of the semiconductor element to the wiring substrate is sealed with molding resin.

20. The semiconductor device according to claim 11, wherein the semiconductor device can be mounted on a mounting substrate via the solder balls.

* * * * *